(12) United States Patent
Kojima

(10) Patent No.: US 10,727,332 B2
(45) Date of Patent: Jul. 28, 2020

(54) SEMICONDUCTOR DEVICE

(71) Applicants: KABUSHIKI KAISHA TOSHIBA, Minato-ku (JP); TOSHIBA ELECTRONIC DEVICES & STORAGE CORPORATION, Minato-ku (JP)

(72) Inventor: Hidenobu Kojima, Kanazawa (JP)

(73) Assignees: KABUSHIKI KAISHA TOSHIBA, Minato-ku (JP); TOSHIBA ELECTRONIC DEVICES & STORAGE CORPORATION, Minato-ku (JP)

( * ) Notice: Subject to any disclaimer, the term of this patent is extended or adjusted under 35 U.S.C. 154(b) by 0 days.

(21) Appl. No.: 16/234,679

(22) Filed: Dec. 28, 2018

(65) Prior Publication Data
US 2020/0083367 A1    Mar. 12, 2020

(30) Foreign Application Priority Data

Sep. 7, 2018  (JP) ................................. 2018-167731

(51) Int. Cl.
*H01L 29/78* (2006.01)
*H01L 29/423* (2006.01)
(Continued)

(52) U.S. Cl.
CPC ...... *H01L 29/7813* (2013.01); *H01L 27/1203* (2013.01); *H01L 29/41741* (2013.01); *H01L 29/4236* (2013.01)

(58) Field of Classification Search
CPC ............. H01L 29/7813; H01L 29/7809; H01L 29/66719; H01L 29/66734; H01L 27/1203
See application file for complete search history.

(56) References Cited

U.S. PATENT DOCUMENTS

| | | | |
|---|---|---|---|
| 8,030,705 B2 | 10/2011 | Jang | |
| 2018/0082997 A1* | 3/2018 | Li | ...................... H01L 27/0617 |
| 2019/0019871 A1* | 1/2019 | Park | .................. H01L 29/41741 |

FOREIGN PATENT DOCUMENTS

| | | |
|---|---|---|
| JP | 4067159 | 3/2008 |
| JP | 2008-270806 | 11/2008 |
| JP | 2013-236013 | 11/2013 |

* cited by examiner

*Primary Examiner* — Changhyun Yi
(74) *Attorney, Agent, or Firm* — Oblon, McClelland, Maier & Neustadt, L.L.P.

(57) ABSTRACT

A semiconductor device includes a substrate, a semiconductor body and a metal layer between the substrate and the semiconductor body. The device further includes first and second electrodes, a first control electrode between the semiconductor body and the first electrode; and a second control electrode between the semiconductor body and the second electrode. The semiconductor body includes a first to fifth semiconductor layers. The second semiconductor layer is provided between the first semiconductor layer and the first electrode. The third semiconductor layer is selectively provided between the second semiconductor layer and the first electrode. The fourth semiconductor layer is provided between the first semiconductor layer and the second electrode. The fifth semiconductor layer selectively provided between the fourth semiconductor layer and the second electrode. The first, third and fifth semiconductor layers are of a first conductivity type. The second and fourth semiconductor layers are of a second conductivity type.

16 Claims, 6 Drawing Sheets

(51) Int. Cl.
*H01L 29/417* (2006.01)
*H01L 27/12* (2006.01)

SEMICONDUCTOR DEVICE

CROSS-REFERENCE TO RELATED APPLICATIONS

This application is based upon and claims the benefit of priority from Japanese Patent Application No. 2018-167731, filed on Sep. 7, 2018; the entire contents of which are incorporated herein by reference.

FIELD

Embodiments relate to a semiconductor device.

BACKGROUND

Semiconductor devices such as diodes, MOSFETs (Metal Oxide Semiconductor Field Effect Transistors), etc., are used in, for example, switching circuits for power control. It is desirable for such semiconductor devices to have small ON-resistance.

DETAILED DESCRIPTION

Figure 1:
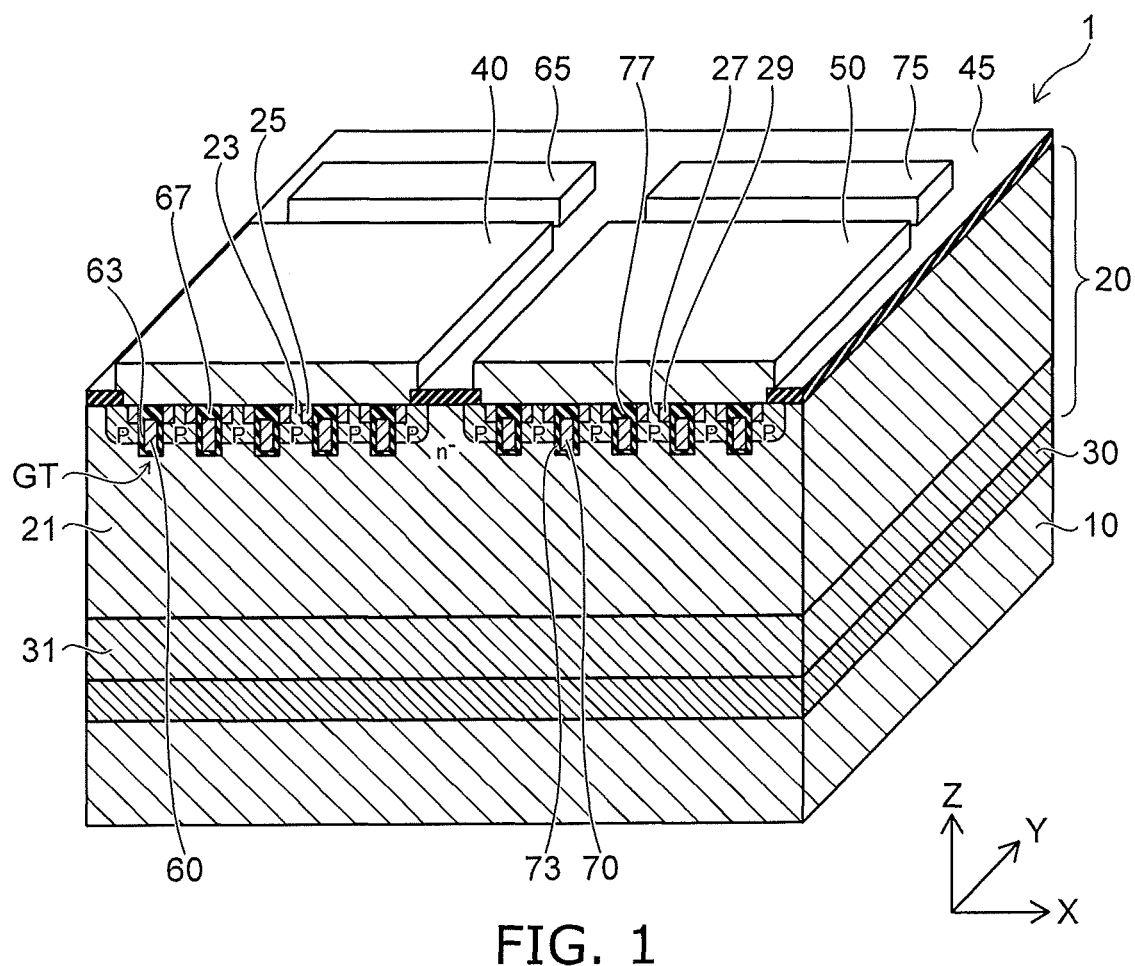
FIG. 1 is a perspective view schematically showing a semiconductor device according to an embodiment.

According to one embodiment, a semiconductor device includes a substrate; a semiconductor body including a first semiconductor layer of a first conductivity type; and a metal layer provided between the substrate and the semiconductor body. The metal layer contacts a back surface of the semiconductor body. The device further includes a first electrode provided on a front surface of the semiconductor body; a second electrode provided on the front surface of the semiconductor body and disposed to be away from the first electrode; a first control electrode provided between the semiconductor body and the first electrode; and a second control electrode provided between the semiconductor body and the second electrode. The semiconductor body includes a second to fifth semiconductor layers. The second semiconductor layer is provided between the first semiconductor layer and the first electrode. The third semiconductor layer is selectively provided between the second semiconductor layer and the first electrode. The fourth semiconductor layer is provided between the first semiconductor layer and the second electrode. The fifth semiconductor layer selectively provided between the fourth semiconductor layer and the second electrode. The second semiconductor layer and the fourth semiconductor layer are of a second conductivity type, and the third semiconductor layer and the fifth semiconductor layer are of the first conductivity type. The first control electrode faces the first semiconductor layer, the second semiconductor layer and the third semiconductor layer via a first insulating film interposed. The first control electrode is electrically insulated from the first electrode by a second insulating film. The second control electrode faces the first semiconductor layer, the fourth semiconductor layer, and the fifth semiconductor layer via a third insulating film interposed. The second control electrode is electrically insulated from the second electrode by a fourth insulating film.

Embodiments will now be described with reference to the drawings. The same portions inside the drawings are marked with the same numerals; a detailed description is omitted as appropriate; and the different portions are described. The drawings are schematic or conceptual; and the relationships between the thicknesses and widths of portions, the proportions of sizes between portions, etc., are not necessarily the same as the actual values thereof. The dimensions and/or the proportions may be illustrated differently between the drawings, even in the case where the same portion is illustrated.

There are cases where the dispositions of the components are described using the directions of XYZ axes shown in the drawings. The X-axis, the Y-axis, and the Z-axis are orthogonal to each other. Hereinbelow, the directions of the X-axis, the Y-axis, and the Z-axis are described as an X-direction, a Y-direction, and a Z-direction. Also, there are cases where the Z-direction is described as upward and the direction opposite to the Z-direction is described as downward.

FIG. 1 is a perspective view schematically showing a semiconductor device 1 according to an embodiment. The semiconductor device 1 includes a substrate 10, a semiconductor body 20, and a metal layer 30. The metal layer 30 is provided between the substrate 10 and the semiconductor body 20. The metal layer 30 is provided to contact the back surface of the semiconductor body 20.

As shown in FIG. 1, the semiconductor device 1 further includes a first electrode 40, a second electrode 50, a first gate electrode 60, a first gate pad 65, a second gate electrode 70, and a second gate pad 75.

The first electrode 40, the second electrode 50, the first gate pad 65, and the second gate pad 75 are provided on the front surface of the semiconductor body 20. The first gate pad 65 and the second gate pad 75 each are disposed, with an insulating film 45 interposed, on the semiconductor body 20 and are electrically insulated from the semiconductor body 20.

The second electrode 50 is disposed to be separated from the first electrode 40. The first gate pad 65 is disposed to be separated from the first electrode 40 and the second electrode 50. The second gate pad 75 is disposed to be separated from the first electrode 40, the second electrode 50, and the first gate pad 65.

The first gate electrode 60 is provided between the semiconductor body 20 and the first electrode 40; and the second gate electrode 70 is provided between the semiconductor body 20 and the second electrode 50.

The semiconductor body 20 includes an n-type semiconductor layer 21, a p-type diffusion layer 23, an n-type source layer 25, a p-type diffusion layer 27, and an n-type source layer 29.

The p-type diffusion layer 23 is provided between the n-type semiconductor layer 21 and the first electrode 40. The n-type source layer 25 is selectively provided between the p-type diffusion layer 23 and the first electrode 40. The first electrode 40 is electrically connected to the p-type diffusion layer 23 and the n-type source layer 25.

The first gate electrode 60 is disposed in the interior of a gate trench GT provided between the semiconductor body 20 and the first electrode 40. The first gate electrode 60 is disposed to oppose the n-type semiconductor layer 21, the p-type diffusion layer 23, and the n-type source layer 25 with a gate insulating film 63 interposed. The first gate electrode 60 is electrically insulated from the first electrode 40 by an insulating film 67. Also, the first gate electrode 60 is electrically connected to the first gate pad 65 at a not-illustrated portion.

The p-type diffusion layer 27 is provided between the n-type semiconductor layer 21 and the second electrode 50. The n-type source layer 29 is selectively provided between the p-type diffusion layer 27 and the second electrode 50. The second electrode 50 is electrically connected to the p-type diffusion layer 27 and the n-type source layer 29.

The second gate electrode 70 is disposed in the interior of the gate trench GT provided between the semiconductor body 20 and the second electrode 50. The second gate electrode 70 is disposed to oppose the n-type semiconductor layer 21, the p-type diffusion layer 27, and the n-type source layer 29 with a gate insulating film 73 interposed. The second gate electrode 70 is electrically insulated from the second electrode 50 by an insulating film 77. Also, the second gate electrode 70 is electrically connected to the second gate pad 75 at a not-illustrated portion.

The semiconductor body 20 further includes an n$^+$-type semiconductor layer 31. The n$^+$-type semiconductor layer 31 is provided between the n-type semiconductor layer 21 and the metal layer 30 and includes an n-type impurity having a higher concentration than the n-type impurity of the n-type semiconductor layer 21. The n$^+$-type semiconductor layer 31 is provided to contact the metal layer 30. For example, the metal layer 30 is provided to have an ohmic contact with the n$^+$-type semiconductor layer 31.

Thus, the semiconductor device 1 includes trench MOSFET structures provided between the metal layer 30 and the first electrode 40 and between the metal layer 30 and the second electrode 50. For example, the metal layer 30 is shared by the two MOSFETs and is a path of a current flowing between the first electrode 40 and the second electrode 50.

Figure 2A:
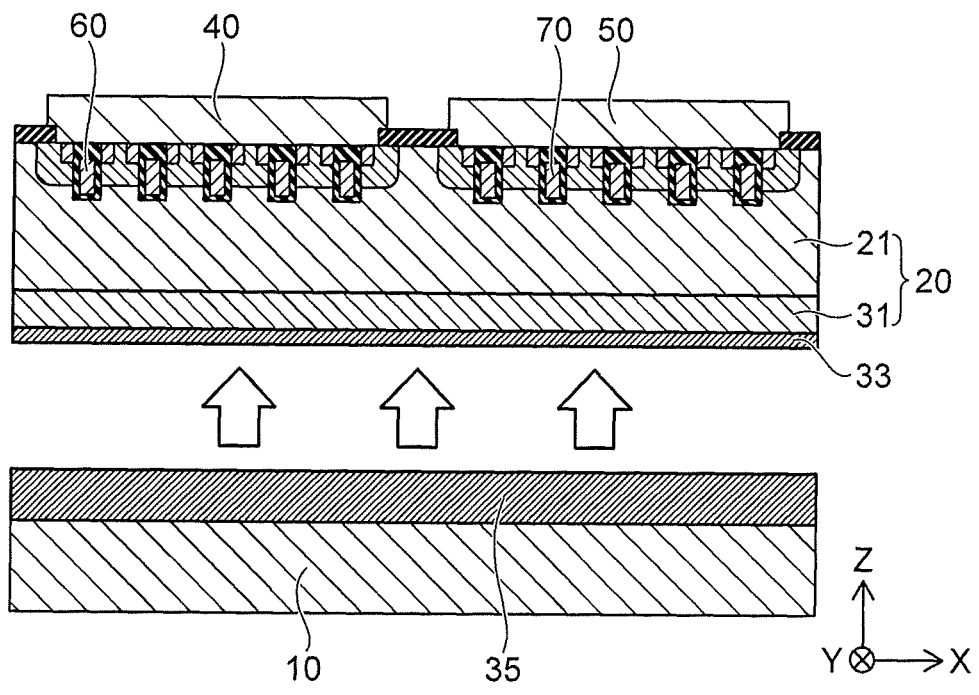
FIGS. 2A and 2B are schematic cross-sectional views showing manufacturing processes of the semiconductor device according to the embodiment.
Figure 2B:
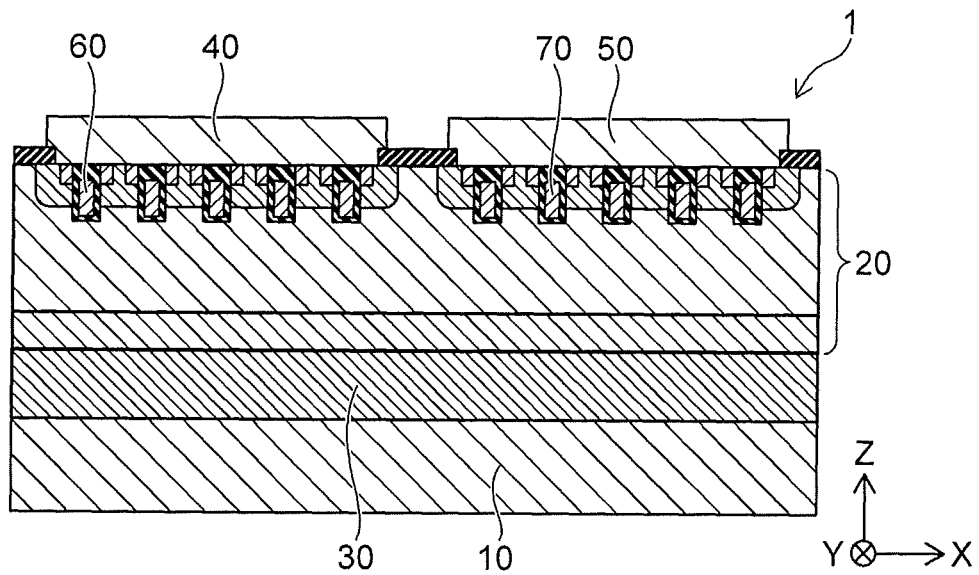

FIGS. 2A and 2B are schematic cross-sectional views showing manufacturing processes of the semiconductor device 1 according to the embodiment.

As shown in FIG. 2A, after forming the MOSFET structures disposed between the n$^+$-type semiconductor layer 31 and the first electrode 40 and between the n$^+$-type semiconductor layer 31 and the second electrode 50, a contact layer 33 is formed on the back surface of the semiconductor body 20.

The n$^+$-type semiconductor layer 31 is, for example, a silicon substrate; and the n-type semiconductor layer 21 is, for example, an n-type silicon layer epitaxially grown on the silicon substrate. After forming the MOSFET structures, for example, the silicon substrate is used to form the n$^+$-type semiconductor layer 31 by thinning by polishing or grinding.

The contact layer 33 is, for example, a metal film having a multilayered structure in which titanium (Ti), nickel (Ni), and gold (Au) are stacked. After forming the contact layer 33, for example, titanium silicide (TiSi) is formed between the n$^+$-type semiconductor layer 31 and the contact layer 33 by performing heat treatment.

Continuing, the substrate 10 is adhered to the backside of the semiconductor body 20 with a metal bonding layer 35 interposed. The metal bonding layer 35 includes, for example, a bonding metal such as a solder material, gold-tin (AuSn) alloy, etc. The substrate 10 is, for example, a semiconductor substrate such as a silicon substrate, etc. Also, the substrate 10 may be, for example, an insulating body such as a glass substrate, etc.

As shown in FIG. 2B, after adhering the substrate 10 to the backside of the semiconductor body 20, the substrate 10 is ground to a prescribed thickness by grinding or polishing. The metal layer 30 includes the contact layer 33 and the metal bonding layer 35. For example, the metal layer 30 has a thickness in the Z-direction of several tens of micrometers.

Figure 3:
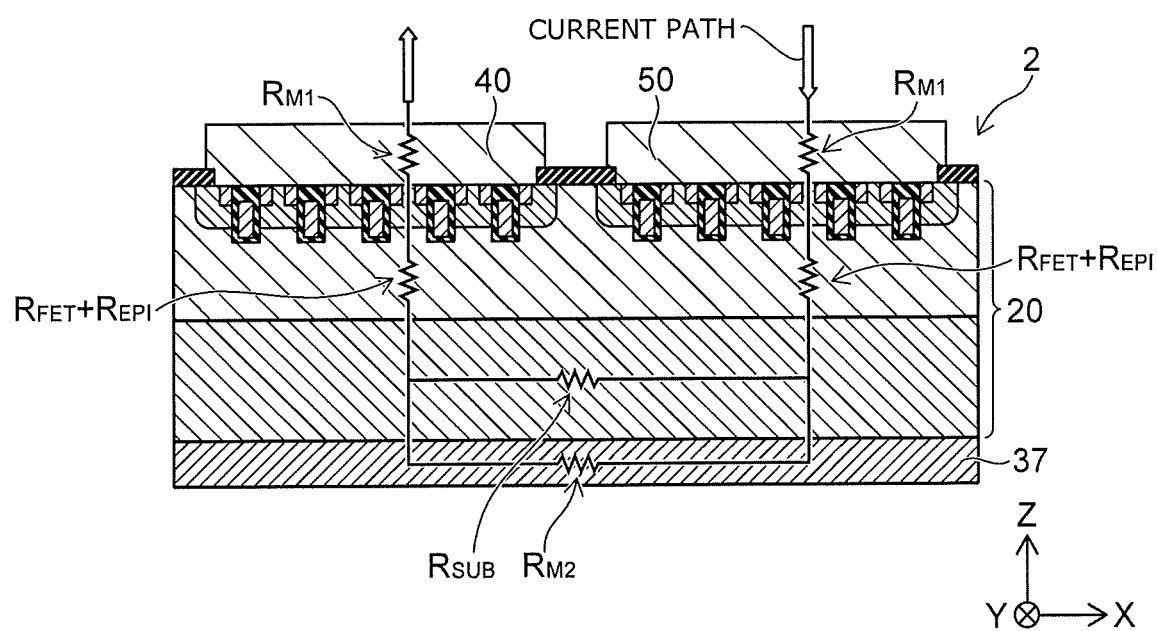
FIG. 3 is a schematic cross-sectional view showing a semiconductor device according to a comparative example.

FIG. 3 is a schematic cross-sectional view showing a semiconductor device 2 according to a comparative example. In the semiconductor device 2, the substrate 10 is not disposed; and a metal layer 37 is provided on the back surface of the semiconductor body 20. The semiconductor device 2 includes MOSFET structures provided between the first electrode 40 and the metal layer 37 and between the second electrode 50 and the metal layer 37.

The semiconductor device 2 is operated by applying a prescribed voltage between the first electrode 40 and the second electrode 50 and by applying gate biases to the gate electrode 60 and the gate electrode 70. When the gate biases are applied to the gate electrode 60 and the gate electrode 70 and the MOSFETs are switched ON, for example, a current flows from the second electrode 50 to the first electrode 40 through paths shown in the drawing.

At this time, the ON-resistance of the semiconductor device 2 includes electrical resistance components $R_{M1}$, $R_{FET}$, $R_{EPI}$, $R_{SUB}$, and $R_{M2}$. $R_{M1}$ is the electrical resistance of each of the first electrode 40 and the second electrode 50. $R_{FET}$ is the channel resistance of the MOSFETs. $R_{EPI}$ is the electrical resistance component in the vertical direction (the Z-direction) of the n-type semiconductor layer 21. $R_{SUB}$ is the electrical resistance component in the horizontal direction (the X-direction) of the n$^+$-type semiconductor layer 31. $R_{M2}$ is the electrical resistance component in the horizontal direction (the X-direction) of the metal layer 37.

For example, the size in the horizontal direction (the X-direction) of the semiconductor device 2 is larger than the size in the vertical direction (the Z-direction) by at least a factor of 10. Accordingly, the size relationship of the electrical resistance components is $R_{SUB} > R_{M2} >> R_{M1}$, $R_{FET}$, and $R_{EPI}$. Therefore, the ON-resistance of the semiconductor device 2 is greatly dependent on the electrical resistance component $R_{SUB}$ of the n$^+$-type semiconductor layer 31 and the electrical resistance component $R_{M2}$ of the metal layer 37.

To reduce the ON-resistance of the semiconductor device 2, it is favorable for $R_{SUB}$ and $R_{M2}$ to be small. In such a case, it is more effective to reduce the electrical resistance component $R_{M2}$ of the metal layer 37 than to reduce the electrical resistance component $R_{SUB}$ of the n$^+$-type semiconductor layer 31 which has a larger electrical resistivity than the metal layer 37. In other words, it is desirable to reduce the electrical resistance component $R_{M2}$ by setting the layer thickness in the Z-direction of the metal layer 37 to be thick.

On the other hand, when the thick metal layer 37 is formed on the back surface of the semiconductor body 20 after forming the n$^+$-type semiconductor layer 31 (referring to FIG. 2A), the warp of the wafer (the silicon substrate) becomes large; and the manufacturing efficiency and the yield degrade.

Conversely, in the semiconductor device 1, by adhering the substrate 10 to the backside of the semiconductor body 20, the warp of the wafer can be suppressed; and the manufacturing efficiency and the yield can be increased. For example, the contact layer 33 is formed on the back surface of the semiconductor body 20 after forming the n$^+$-type semiconductor layer 31 by thinning the wafer. For example, it is sufficient for the contact layer 33 to have a thickness such that an ohmic contact with the n+-type semiconductor layer 31 can be formed. Accordingly, by reducing the layer thickness of the contact layer 33, the warp of the wafer can be suppressed. Further, the substrate 10 is adhered with the metal bonding layer 35 interposed. In such a case, the warp of the wafer can be suppressed by the substrate 10. Accordingly, the electrical resistance component $R_{M2}$ can be reduced by forming the metal layer 30 to be thick.

Thus, in the semiconductor device 1 according to the embodiment, by providing the metal layer 30 between the substrate 10 and the semiconductor body 20, the ON-resistance can be reduced and the manufacturing efficiency and the yield can be increased while suppressing the warp of the wafer.

Figure 4A:
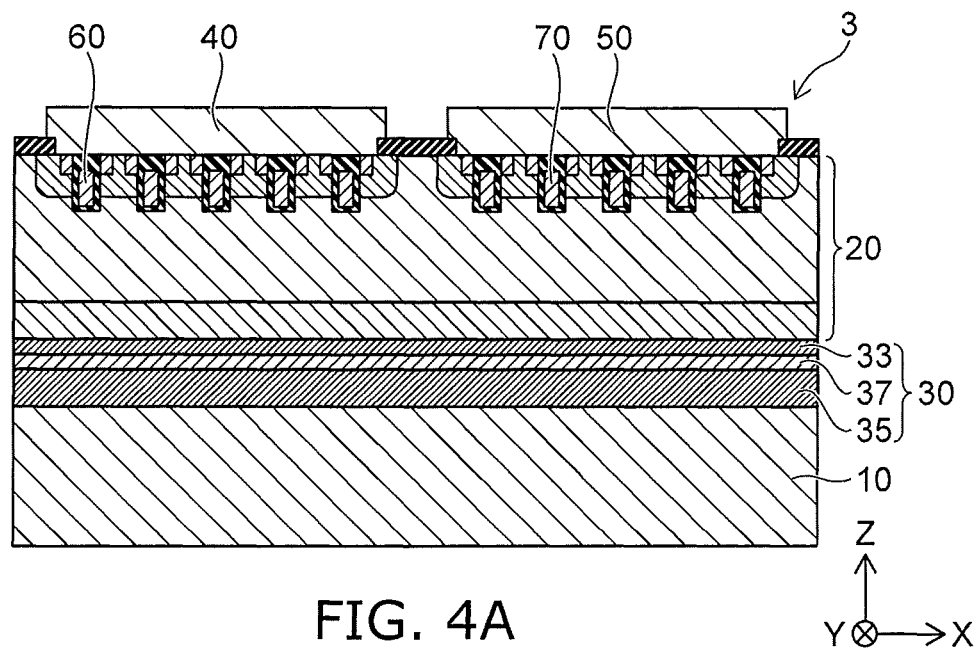
FIGS. 4A to 4C are schematic cross-sectional views showing semiconductor devices according to modifications of the embodiment.
Figure 4B:
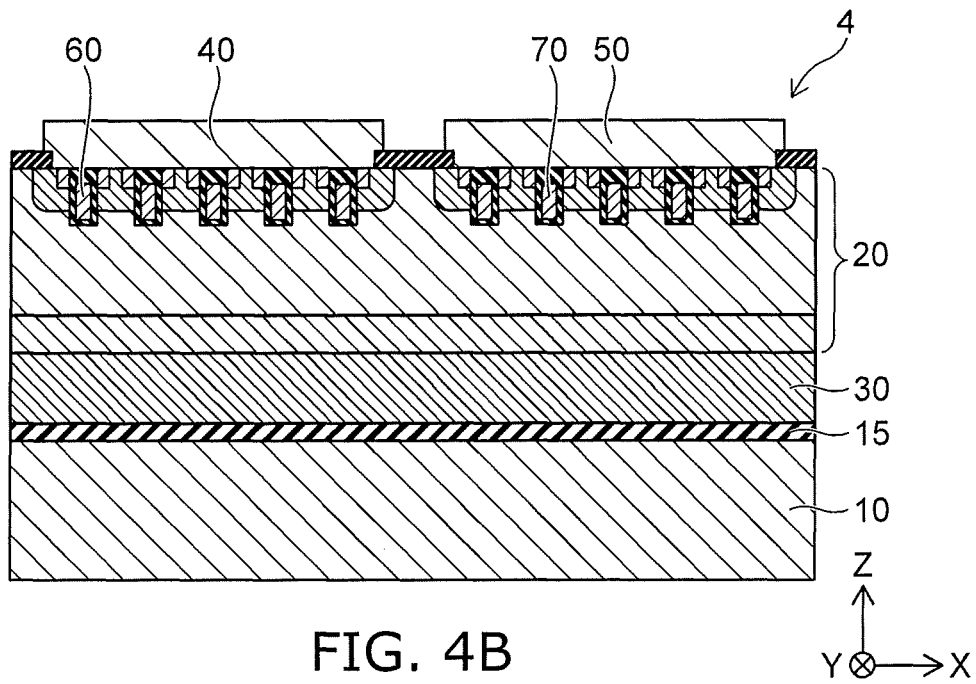
Figure 4C:
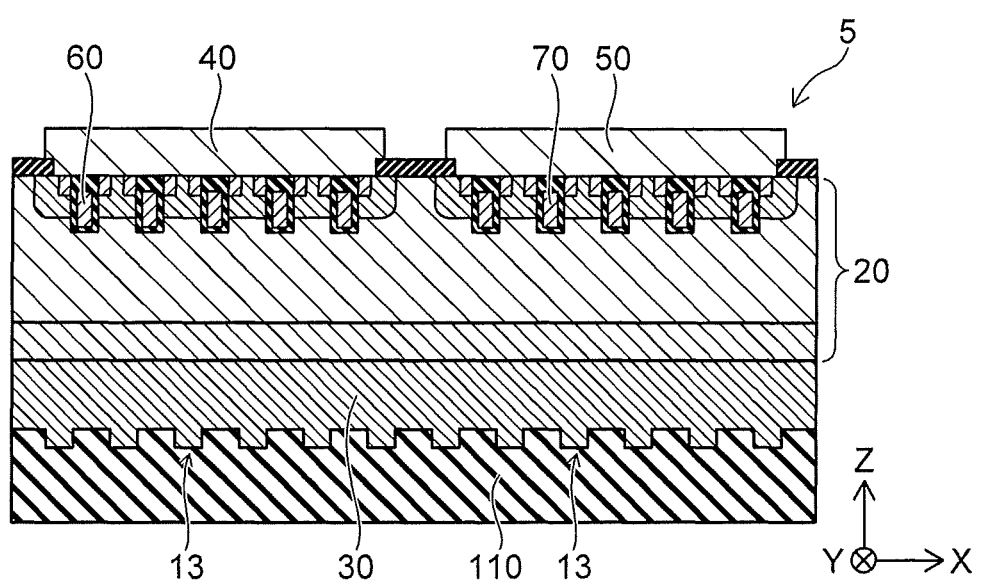

FIGS. 4A to 4C are schematic cross-sectional views showing semiconductor devices 3, 4 and 5 according to modifications of the embodiment.

In the semiconductor device 3 shown in FIG. 4A, the metal layer 30 includes the contact layer 33, the metal bonding layer 35, and the barrier metal layer 37. The barrier metal layer 37 is provided between the contact layer 33 and the metal bonding layer 35. For example, when adhering the substrate 10 to the back surface of the semiconductor body 20, the barrier metal layer 37 prevents the contact layer 33 and the metal bonding layer 35 from reacting. The barrier metal layer 37 includes, for example, nickel (Ni), titanium nitride (TiN), platinum (Pt), etc.

In the semiconductor device 4 shown in FIG. 4B, an insulating film 15 is provided between the substrate 10 and the metal layer 30. The insulating film 15 includes, for example, a dielectric such as silicon oxide, etc. For example, the insulating film 15 is formed on the substrate 10 before forming the metal bonding layer 35 on the substrate 10 (referring to FIG. 2A).

For example, in the case where the substrate 10 is conductive, the flow of the current to the substrate 10 can be suppressed by providing the insulating film 15. Thereby, for example, the temperature change of the ON-resistance caused by the substrate 10 can be suppressed. Also, by providing the insulating film 15, for example, the adhesion between the substrate 10 and the metal bonding layer 35 can be improved.

In the semiconductor device 5 shown in FIG. 4C, concave portions 13 are provided on a front surface side of the substrate 110. The substrate 110 is, for example, an electrically insulating substrate, in which the concave portions 13 mitigate strain. Alternately, the substrate 110 may include a plurality of through holes extending from the front surface to the back surface.

Figure 5A:
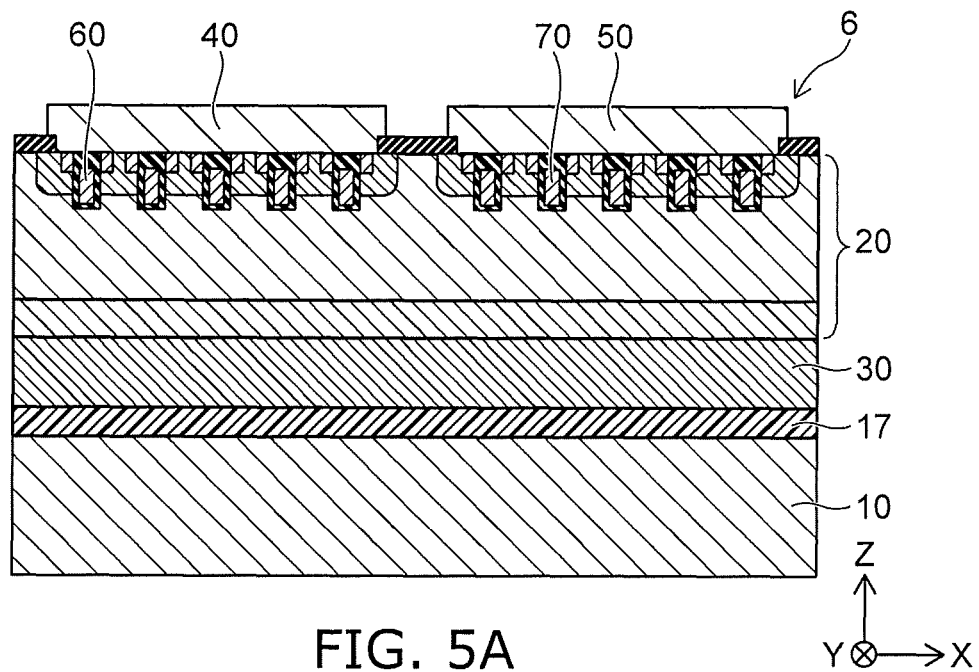
FIGS. 5A and 5B are schematic views showing a semiconductor device according to other modification of the embodiment.
Figure 5B:
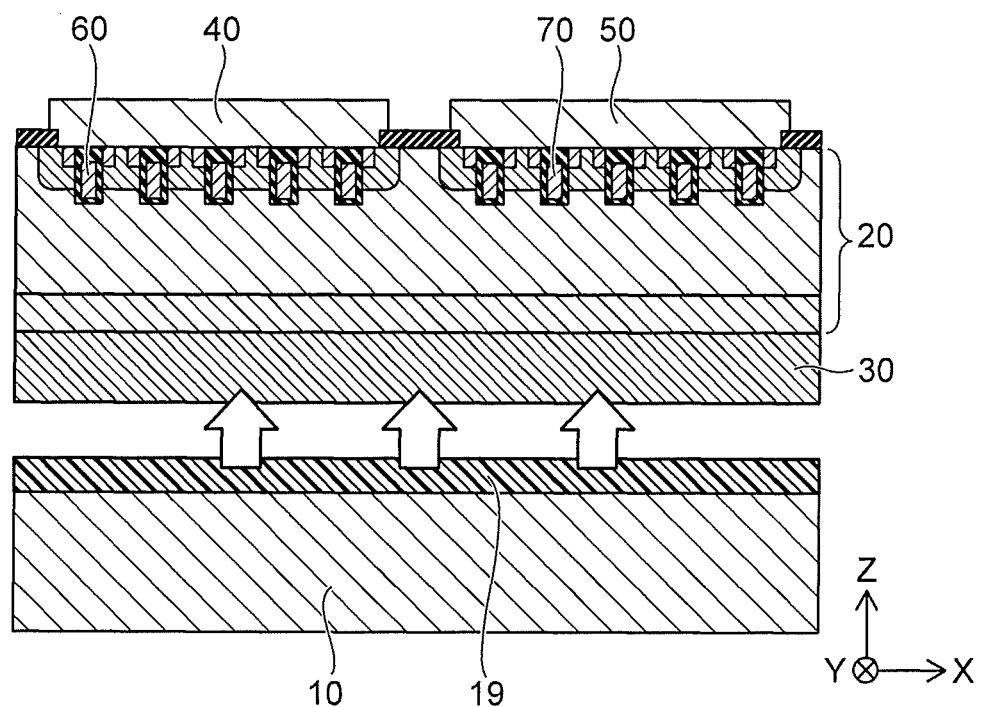

FIGS. 5A and 5B are schematic views showing a semiconductor device 6 according to other modification of the embodiment. FIG. 5A is a cross-sectional view showing the structure of the semiconductor device 6. FIG. 5B is a schematic cross-sectional view showing a manufacturing process of the semiconductor device 6.

As shown in FIG. 5A, the semiconductor device 6 includes a resin layer 17 between the substrate 10 and the metal layer 30. For example, the resin layer 17 is insulative and is formed by curing a bonding material such as polyimide, an epoxy resin, etc.

As shown in FIG. 5B, the substrate 10 is adhered to the metal layer 30 with a bonding material 19 interposed after the metal layer 30 is formed on the back surface of the semiconductor body 20. Thus, the warp of the semiconductor body 20 can be corrected by bonding the substrate 10 and the semiconductor body 20.

In the example, the temperature can be lowered in the process of adhering the substrate 10 to the semiconductor body 20 in which the MOSFETs are formed. Thereby, for example, thermal damage of the MOSFETs can be avoided. Also, the manufacturing process of adhering the substrate 10 is easy.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device, comprising:
   a substrate;
   a semiconductor body including a first semiconductor layer of a first conductivity type;
   a metal layer provided between the substrate and the semiconductor body, the metal layer contacting a back surface of the semiconductor body;
   an insulating body provided between the metal layer and the substrate, the insulating body including dielectric material;
   a first electrode provided on a front surface of the semiconductor body;
   a second electrode provided on the front surface of the semiconductor body and disposed to be away from the first electrode;
   a first control electrode provided between the semiconductor body and the first electrode; and
   a second control electrode provided between the semiconductor body and the second electrode,
   the semiconductor body including a second semiconductor layer provided between the first semiconductor layer and the first electrode, a third semiconductor layer selectively provided between the second semiconductor layer and the first electrode, a fourth semiconductor layer provided between the first semiconductor layer and the second electrode, and a fifth semiconductor layer selectively provided between the fourth semiconductor layer and the second electrode, the second semiconductor layer and the fourth semiconductor layer being of a second conductivity type, the third semiconductor layer and the fifth semiconductor layer being of the first conductivity type,
   the first control electrode facing the first semiconductor layer, the second semiconductor layer and the third semiconductor layer via a first insulating film interposed, the first control electrode being electrically insulated from the first electrode by a second insulating film,
   the second control electrode facing the first semiconductor layer, the fourth semiconductor layer, and the fifth semiconductor layer via a third insulating film interposed, the second control electrode being electrically insulated from the second electrode by a fourth insulating film.

2. The device according to claim 1, wherein the semiconductor body includes trenches provided on the front surface side, and the first control electrode and the second control electrode are disposed in the trenches.

3. The device according to claim 1, wherein
the semiconductor body further includes a sixth semiconductor layer of a first conductivity type provided between the first semiconductor layer and the metal layer, the sixth semiconductor layer including a first conductivity type impurity having a higher concentration than a concentration of a first conductivity type impurity in the first semiconductor layer, and
the metal layer is electrically connected to the sixth semiconductor layer.

4. The device according to claim 1, wherein
the first electrode is electrically connected to the second semiconductor layer and the third semiconductor layer, and
the second electrode is electrically connected to the fourth semiconductor layer and the fifth semiconductor layer.

5. The device according to claim 1, wherein the substrate is a conductive semiconductor substrate.

6. The device according to claim 1, wherein the dielectric material is resin.

7. The device according to claim 1, wherein the dielectric material is silicon oxide.

8. The device according to claim 1, wherein the metal layer has a stacked structure of titanium, nickel, and gold.

9. The device according to claim 1, wherein
the semiconductor body includes silicon, and
the metal layer is electrically connected to the semiconductor body via a silicided metallic element.

10. The device according to claim 1, further comprising:
a third electrode provided on the front surface of the semiconductor body with a fifth insulating film interposed, the third electrode being electrically connected to the first control electrode; and
a fourth electrode provided on the front surface of the semiconductor body with a sixth insulating film interposed, the fourth electrode being electrically connected to the second control electrode,
the third electrode and the fourth electrode being away from the first electrode and the second electrode, the third electrode being away from the fourth electrode.

11. The device according to claim 1, wherein the dielectric material is adhesive.

12. A semiconductor device, comprising:
a substrate;
a semiconductor body including a first semiconductor layer of a first conductivity type;
a metal layer provided between the substrate and the semiconductor body, the metal layer contacting a back surface of the semiconductor body, the metal layer including a contact layer, a barrier layer and a metal bonding layer, the contact layer being provided between the semiconductor layer and the barrier layer, the metal bonding layer being provided between the barrier layer and the substrate;
a first electrode provided on a front surface of the semiconductor body;
a second electrode provided on the front surface of the semiconductor body and disposed to be away from the first electrode;
a first control electrode provided between the semiconductor body and the first electrode; and
a second control electrode provided between the semiconductor body and the second electrode,
the semiconductor body including a second semiconductor layer provided between the first semiconductor layer and the first electrode, a third semiconductor layer selectively provided between the second semiconductor layer and the first electrode, a fourth semiconductor layer provided between the first semiconductor layer and the second electrode, and a fifth semiconductor layer selectively provided between the fourth semiconductor layer and the second electrode, the second semiconductor layer and the fourth semiconductor layer being of a second conductivity type, the third semiconductor layer and the fifth semiconductor layer being of the first conductivity type,
the first control electrode facing the first semiconductor layer, the second semiconductor layer and the third semiconductor layer via a first insulating film interposed, the first control electrode being electrically insulated from the first electrode by a second insulating film,
the second control electrode facing the first semiconductor layer, the fourth semiconductor layer, and the fifth semiconductor layer via a third insulating film interposed, the second control electrode being electrically insulated from the second electrode by a fourth insulating film.

13. The device according to claim 12, wherein the metal bonding layer includes a solder material or gold-tin alloy.

14. The device according to claim 12, wherein the contact layer of the metal layer includes titanium; the barrier layer includes nickel; and the metal bonding layer includes gold.

15. The device according to claim 12, wherein
the semiconductor body includes silicon, and
the contact layer of the metal layer is electrically connected to the semiconductor body by a silicided metallic element.

16. The device according to claim 12, wherein the substrate is an insulating body including a recess or a through-hole.

* * * * *